United States Patent
Maurino et al.

(10) Patent No.: US 8,779,958 B1
(45) Date of Patent: Jul. 15, 2014

(54) CONTINUOUS TIME INPUT STAGE

(71) Applicants: Roberto S. Maurino, Turin (IT); Sanjay Rajasekhar, Bangalore (IN); Abhilasha Kawle, Bangalore (IN)

(72) Inventors: Roberto S. Maurino, Turin (IT); Sanjay Rajasekhar, Bangalore (IN); Abhilasha Kawle, Bangalore (IN)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/747,241

(22) Filed: Jan. 22, 2013

(51) Int. Cl.
*H03M 1/66* (2006.01)
*H03M 3/00* (2006.01)
*H03M 1/74* (2006.01)

(52) U.S. Cl.
CPC *H03M 1/66* (2013.01); *H03M 3/30* (2013.01); *H03M 1/745* (2013.01)
USPC .......................................... 341/144

(58) Field of Classification Search
CPC .................................. H03M 1/66; H03M 3/30
USPC .................... 341/144, 120, 118, 143
See application file for complete search history.

(56) References Cited

U.S. PATENT DOCUMENTS

| | | | | |
|---|---|---|---|---|
| 4,978,959 | A * | 12/1990 | Chong et al. | 341/161 |
| 6,061,010 | A | 5/2000 | Adams et al. | |
| 6,477,358 | B1 * | 11/2002 | Mader et al. | 455/91 |
| 6,639,534 | B2 * | 10/2003 | Khoini-Poorfard et al. | 341/144 |
| 7,095,345 | B2 * | 8/2006 | Nguyen et al. | 341/120 |
| 7,227,420 | B2 * | 6/2007 | Schimper | 330/310 |
| 7,277,035 | B1 * | 10/2007 | You et al. | 341/144 |
| 7,548,180 | B2 * | 6/2009 | Jensen et al. | 341/143 |

OTHER PUBLICATIONS

Nguyen et al., "A 106dB SNR Hybrid Oversampling ADC for Digital Audio," IEEE International Solid-State Circuits Conference 2005, Digest of Technical Papers, pp. 176-177, 591, Feb. 2005.
Mitteregger et al., "A 20-mW 640-MHz CMOS Continuous-Time ADC with 20-MHz Signal Bandwidth, 80-dB Dynamic Range and 12-bit ENOB," IEEE Journal of Solid-State Circuits, vol. 41, No. 12, pp. 2641-2649, Dec. 2006.
Adams et al., "A 113-dB SNR Oversampling DAC with Segmented Noise-Shaped Scrambling," IEEE Journal of Solid-State Circuits, vol. 33, No. 12, Dec. 1998, pp. 1871-1878.

* cited by examiner

*Primary Examiner* — Brian Young
(74) *Attorney, Agent, or Firm* — Kenyon & Kenyon LLP

(57) ABSTRACT

A continuous time input stage including a first digital-to-analog converter (DAC) including a first DAC code input, a second DAC including a second DAC code input, a first set of switches coupled to the output of the first DAC, a second set of switches coupled to the output of the second DAC, and an amplifier configured to receive the output of either the first DAC or the second DAC.

22 Claims, 10 Drawing Sheets

CONTINUOUS TIME INPUT STAGE

BACKGROUND

In a conventional continuous time sigma delta (CTSD) analog-to-digital converter (ADC), code transition glitches in the feedback DAC and intersymbol interference (ISI) may severely degrade accuracy. A scheme that makes a continuous time sigma delta ADC robust to ISI and DAC glitches has been described in U.S. Pat. No. 7,095,345, which is hereby incorporated by reference in its entirety. According to the described scheme, an input stages for a CTSD ADC may disconnect input resistors and a feedback DAC from integrators for a time period every clock cycle. During this time, the DAC may be updated with a new DAC input code. In this manner, errors from the DAC may not be propagated to the integrators. Further, disconnecting the DAC during this time may effectively implement a return to zero DAC, which may reduce ISI. However, disconnecting the DAC in this manner may also greatly reduce alias rejection, which is a desirable feature of conventional continuous time ADCs.

As illustrated in FIG. 1, conventional continuous time sigma delta ADC 100 may comprise a summing circuit 110, continuous time integrator 120, integrators 130, analog-to-digital converter (ADC) 140, and DAC 160. Summing circuit 110 may accept an analog input 105. The output of summing circuit 110 may be connected to the input of continuous time integrator 120. The output of continuous time integrator 120 may be connected to the input of integrators 130, which may be one or more integrators. Other integrators may be used in subsequent stages, and these other integrators may be continuous time integrators, or partly continuous time and partly switched capacitor in a hybrid implementation. The output of integrators 130 may be connected to the inputs of ADC 140, which may be a one-bit or multi-bit ADC that acts as a quantizer. The output of ADC 140 forms output 150 and also may be input into DAC 160. The output of DAC 160 may be connected to the negative input of summing circuit 110. The scheme illustrated within FIG. 1 may suffer from disadvantages. For example, sigma delta ADC 100 may suffer from poor linearity caused by glitches in the operation of the DAC and may include ISI, which may degrade performance.

FIG. 2 illustrates a continuous time integration scheme similar to that disclosed within U.S. Pat. No. 7,095,345, referenced above. A sigma delta modulator with a continuous time input stage 200 may comprise DAC 205, input resistors 217 and 219, switches 225, 230, and 235, capacitors 245 and 250, and amplifier 240. In the illustrated scheme, DAC 205 is disconnected using switches 225 and 235 before updating the input DAC code 210. DAC 205 is reconnected only upon being updated to a new code. While DAC 205 is disconnected, the input may be disconnected as well. This scheme may provide for increased jitter tolerance, smaller cap sizes and larger tuning range. A major drawback to this scheme is a reduction in antialiasing.

FIG. 3 illustrates timing diagram 300 associated with FIG. 2. Timing diagram 300 illustrates a master clock (MCLK) 310, INT_CLK 320, INT_CLKB 330, and DAC CODES 340. As illustrated, when INT_CLK 320 is high during time period T1 350, INT_CLKB 330 is low. During time period T2 360, a new DAC code may be input.

As discussed above, the scheme illustrated within FIG. 2 and FIG. 3 may result in reduced anti-aliasing. Standard continuous time sigma delta ADCs are well known to reject aliases of the signal bandwidth at multiples of the clock frequency, with alias rejection of more than 70 dB being possible. Disconnecting the input may be the equivalent to multiplying it by a square wave, which may be either zero or one. The square wave may be at the clock frequency and may contain all of its harmonics. Multiplying in the time domain corresponds to mixing in the frequency domain. Hence, the scheme illustrated within FIG. 2 may downconvert signals at all the harmonics of the clock frequency, losing most of the continuous time antialiasing benefits.

FIG. 4 shows the alias rejection, and degradation thereof, for the scheme described above in FIG. 2 at the clock frequency, two times the clock frequency and three times the clock frequency. The alias rejection is plotted against the ratio d of the interval the input stays disconnected and the modulator clock period, which may correspond to T2/(T1+T2), for example, with reference to FIG. 3.

DETAILED DESCRIPTION

The present invention relates to an improved continuous time input stage, which may be used with a sigma delta analog-to-digital convertor. The continuous time input stage may minimize, or be free of, ISI. Further, the continuous time input stage may maintain the rejection of input aliases around multiples of a clock frequency. In an embodiment of the present invention, the continuous time input stage may include a chopping mechanism, which may reject offset and 1/f noise of an operational transconductance amplifier (OTA).

Embodiments of the present invention provide a sigma delta modulator with a continuous time input stage. The continuous time input stage may use a pair of alternating DACs and input resistors, which may keep the input always connected to an integrator. In this manner, mixing input may be avoided and anti-aliasing may suffer little to no degradation.

Figure 5:
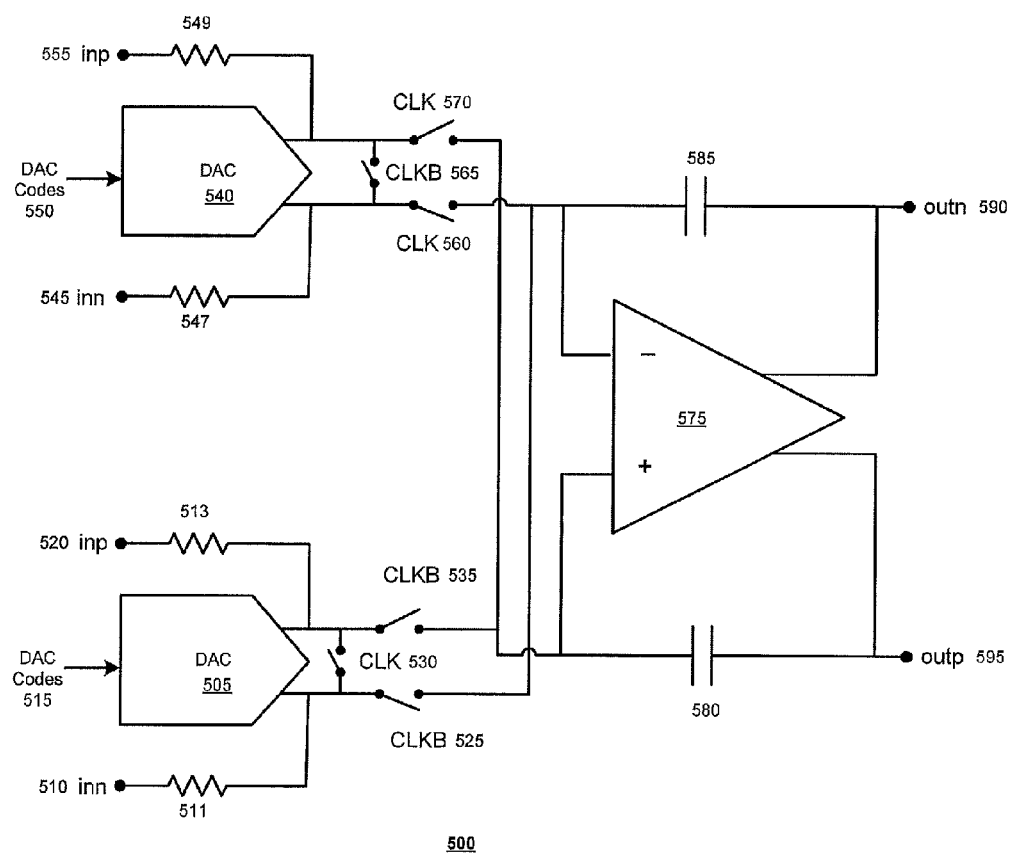
FIG. 5 illustrates an input stage of a continuous time sigma delta modulator ADC according to an embodiment of the present invention.

FIG. 5 illustrates an embodiment of the present invention. Sigma delta modulator with a continuous time input stage 500 may comprise DACs 505 and 540. DAC 505 may have a DAC code input 515 and DAC 540 may have a DAC code input 550. Input resistors 511, 513, 547 and 549 may follow inputs 510, 520, 545 and 555, respectively. A series of switches 525, 530 and 535 may be used to connect and disconnect DAC 505. A series of switches 560, 565 and 570 may be used to connect and disconnect DAC 540. The output of DAC 505 may be connected to the input of amplifier 575 via switches 525 and 535. The output of DAC 540 may be connected to the input of amplifier 575 via switches 560 and 570. The output of amplifier 575, which may be an OTA, may lead to outputs 590 and 595, and also provide input to capacitors 580 and 585.

Figure 1:
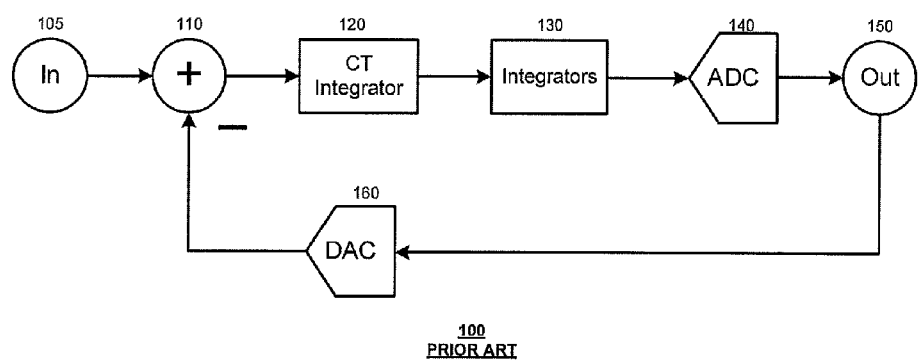
FIG. 1 illustrates a conventional sigma delta modulator with a continuous time input stage.
Figure 2:
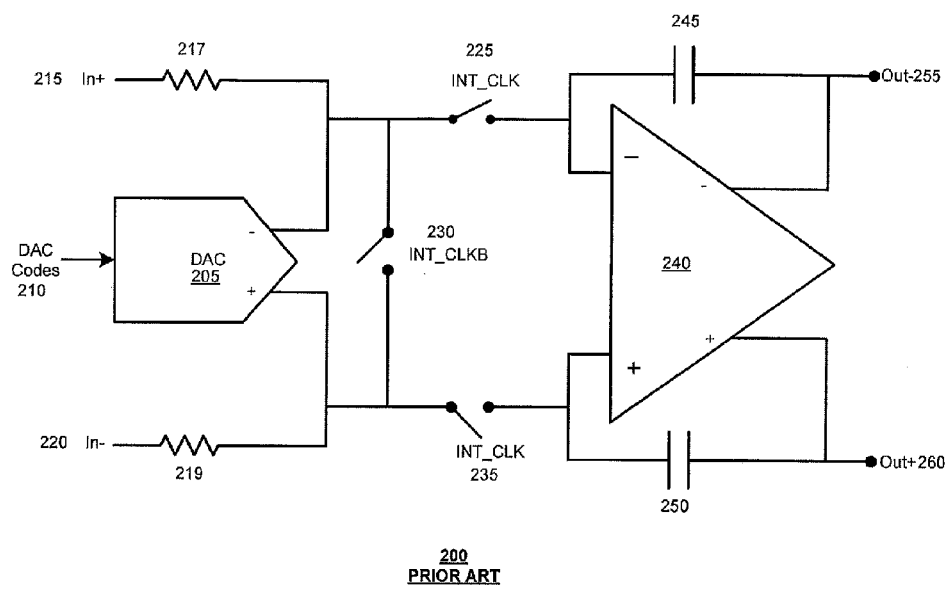
FIG. 2 illustrates an input integrating stage of a continuous time sigma delta modulator.
Figure 3:
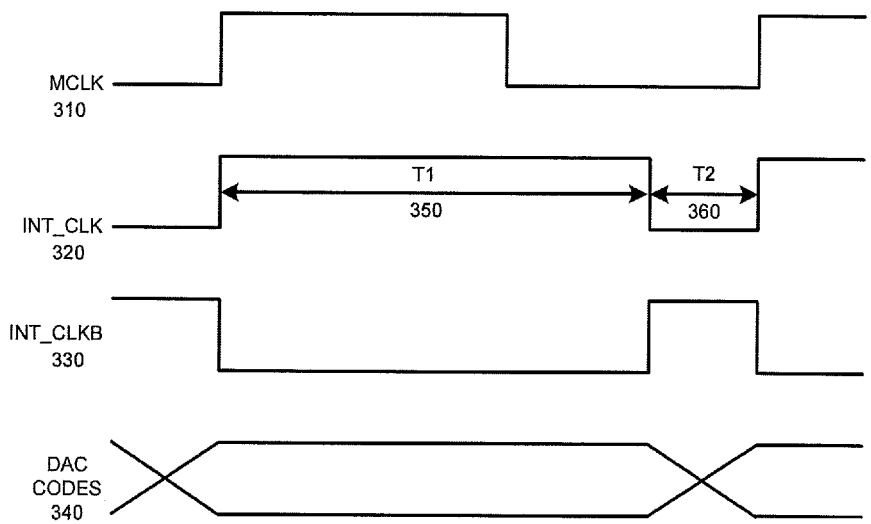
FIG. 3 illustrates a timing diagram for the input stage of a continuous time sigma delta modulator ADC.
Figure 4:
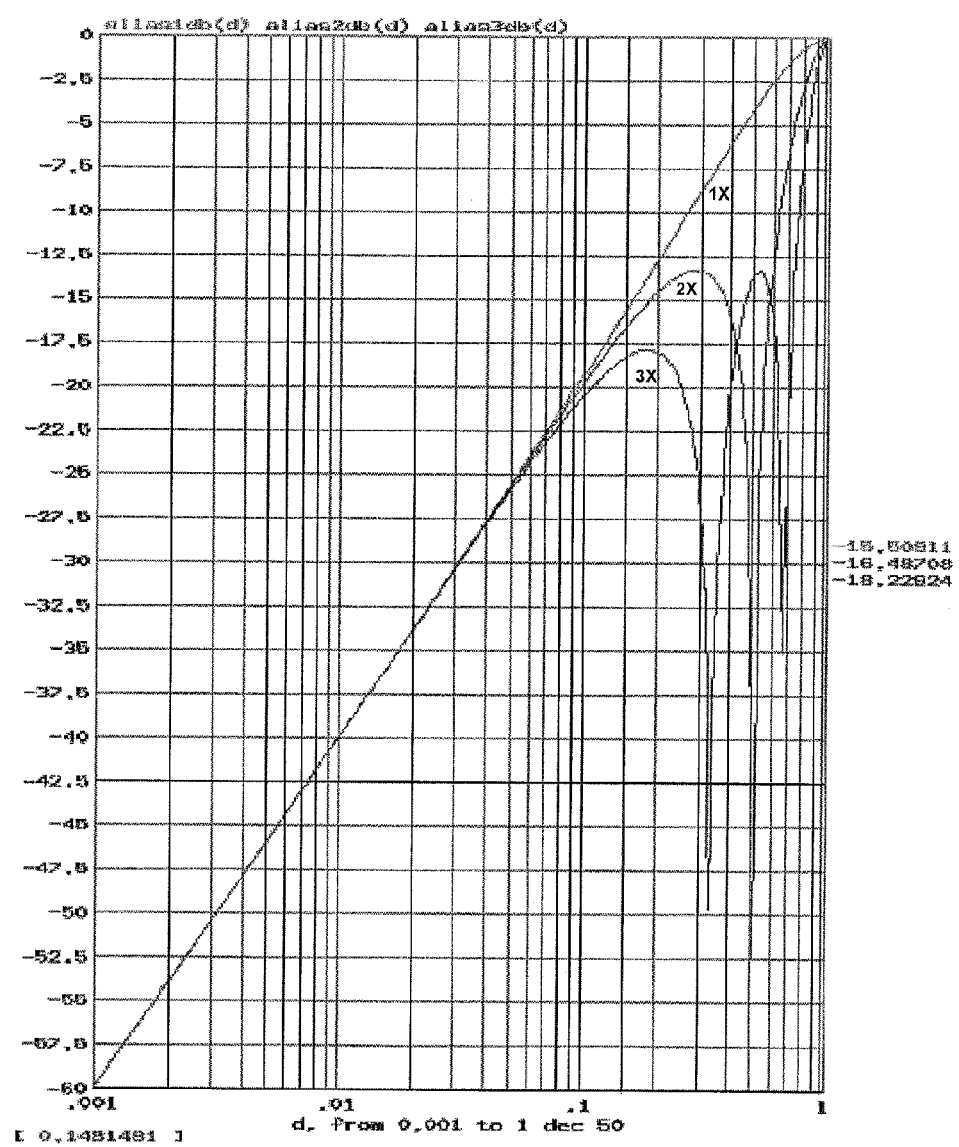
FIG. 4 is a graph illustrating the degradation of the anti-aliasing of a continuous time sigma delta modulator ADC.

The scheme illustrated within FIG. 5 may be used to avoid the degradation of antialiasing discussed above with respect to FIG. 2. As illustrated, the scheme uses a pair of DACs, 505 and 540, and input resistors 511, 513 and 547, 549 respectively, working in alternate phases. While one DAC, 505 for example, is connected to the integrator, the other DAC 540 may be updating to a new code from code input 550. Likewise, when DAC 540 is connected to the integrator, DAC 505 may be updating to a new code from code input 515. Thus, the input may always be connected to the integrator, so input mixing may be avoided and anti-aliasing may not be degraded. At the same time, feedback DAC transition glitches may be prevented from corrupting the charge stored across integrating capacitors 585 and 580, since for each DAC, glitches may occur while the DAC is disconnected from the integrator and the glitches may be shorted out by either switch 565 or switch 530. Finally, ISI may be avoided since each DAC effectively implements a return to zero operation.

Figure 6:
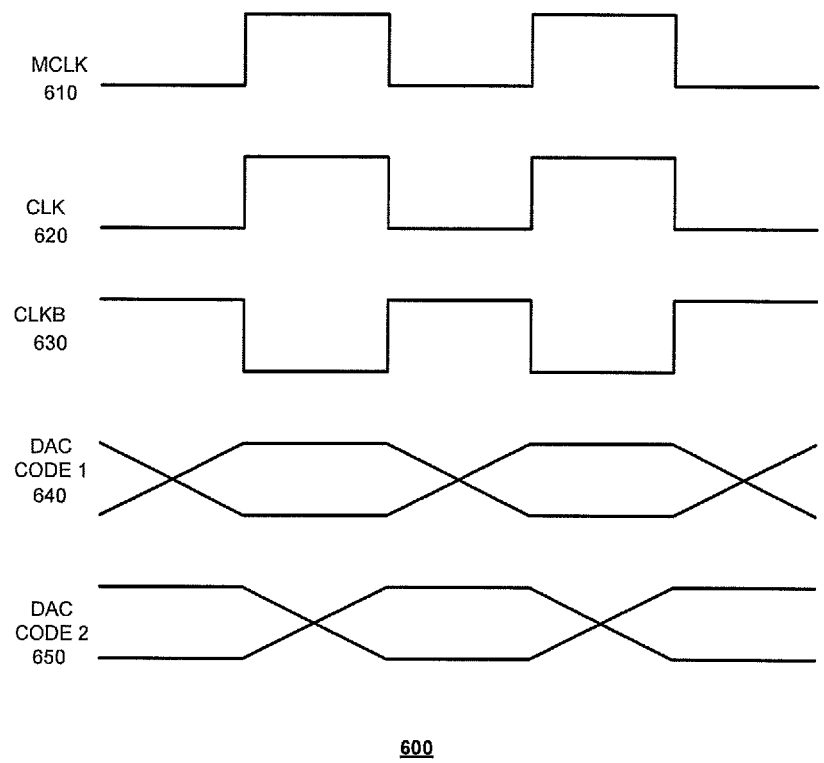
FIG. 6. illustrates a timing diagram for a sigma delta modulator with a continuous time input stage according to an embodiment of the present invention.

FIG. 6 illustrates a timing diagram for a sigma delta modulator with a continuous time input stage according to an embodiment of the present invention. As illustrated, timing diagram 600 comprises master clock 610, CLK 620, CLKB 630, DAC CODE 640 and DAC CODE 650. When CLK 620 is high and CLKB 630 is low, DAC 540 may be connected and DAC 505 may be updated with a new DAC code via DAC code input 515, for example. When CLK 620 is low and CLKB 630 is high, DAC 505 may be connected and DAC 540 may be updated with a new DAC code via DAC code input 550, for example. In this manner, the input is always connected to the integrator, while new DAC codes may be used. Thus input mixing may be avoided and anti-aliasing may not be degraded.

Figure 7:
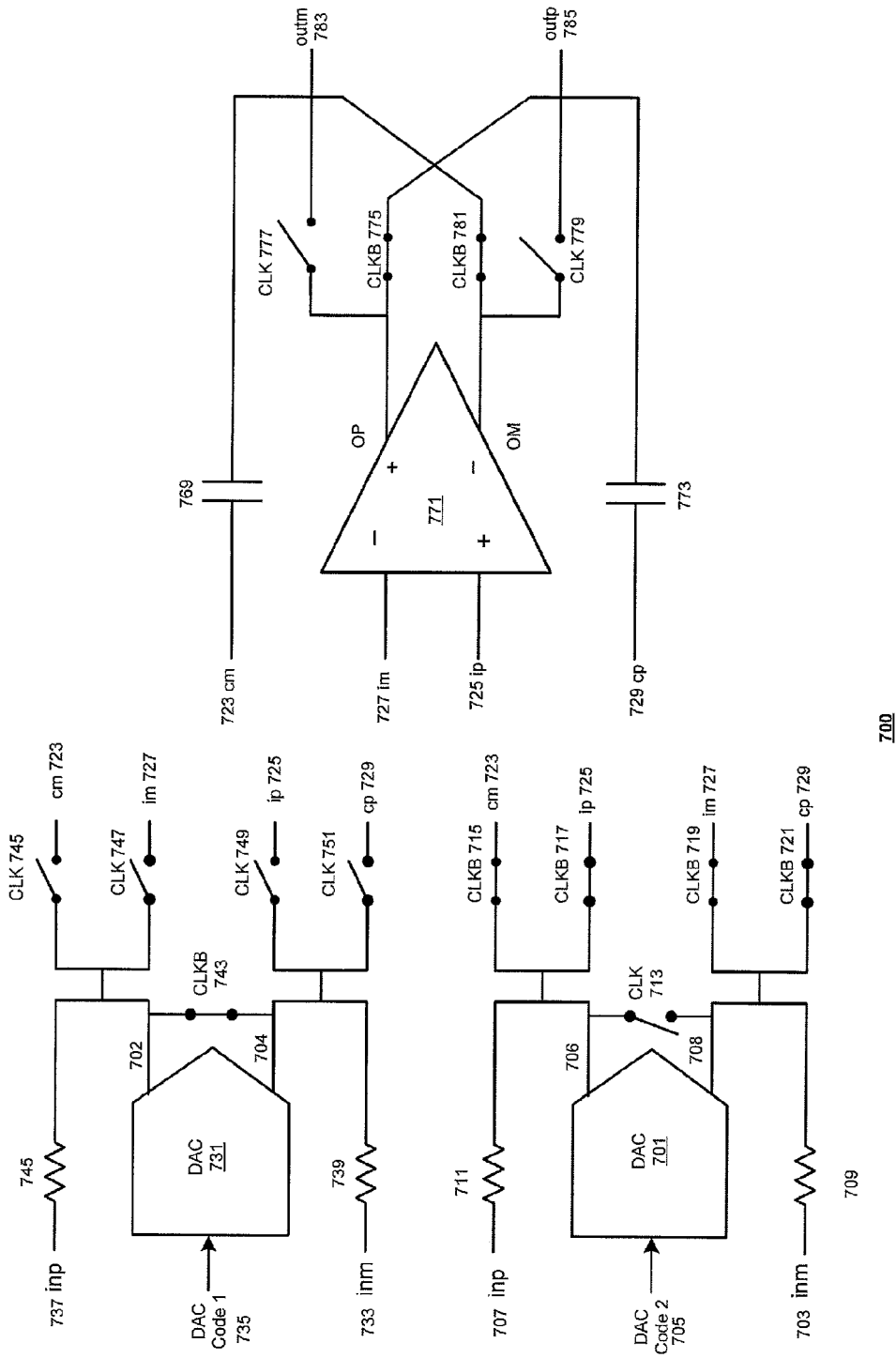
FIG. 7. illustrates an input stage of a continuous time sigma delta modulator ADC according to an embodiment of the present invention.

FIG. 7 illustrates an embodiment of the present invention. Sigma delta modulator with a continuous time input stage 700 may comprise DACs 701 and 731. DAC 701 may have a DAC code input 705 and DAC 731 may have a DAC code input 735. Input resistors 709, 711, 739 and 745 may follow inputs 703, 707, 733 and 737, respectively. A series of switches 713-721 may be used to connect and disconnect DAC 701. A series of switches 743-751 may be used to connect and disconnect DAC 731. The outputs 702, 704 of DAC 731 may be connected to capacitor terminals 723 and 729 and inputs 725 and 727 of amplifier 771 via switches 745-751. The outputs 706, 708 of DAC 701 may be connected to capacitor terminals 723 and 729 and inputs 725 and 727 of amplifier 771 via switches 715-721. The output of amplifier 771, which may be an OTA, may lead to outputs 783 and 785, and also provide input to capacitors 769 and 773. The output of amplifier 771 may be configured in a chopping scheme, such that switches 775-781 control the output of amplifier 771.

The timing diagram illustrated within FIG. 6 may also be applicable for a sigma delta modulator with a continuous time input stage according to the embodiment illustrated within FIG. 7. As illustrated, timing diagram 600 comprises master clock 610, CLK 620, CLKB 630, DAC CODE 640 and DAC CODE 650. For example, CLK 620 may correspond to one DAC, such as DAC 731, and CLKB may correspond to the other DAC, such as DAC 701. When CLK 620 is high and CLKB 630 is low, DAC 731 may be connected and DAC 701 may be updated with a new DAC code via DAC code input 705, for example. When CLK 620 is low and CLKB 630 is high, DAC 701 may be connected and DAC 731 may be updated with a new DAC code via DAC code input 735, for example. In this manner, the input is always connected to the integrator, while new DAC codes may be used. Thus input mixing may be avoided and anti-aliasing may not be degraded.

In the scheme illustrated within FIG. 7, the switches used to connect the DACs and associated input resistors may be used to chop the integrator OTA at the master CLK rate. In FIG. 7, switches are shown closed or open as per CLKB high phase (CLK low). When CLKB is high, the OTA outputs op and om may be connected to integrator outputs outp and outm, respectively. The OTA inputs ip and im may be connected to positive input resistor 711 and negative input resistor 709, respectively. They may also be connected to DAC 701 and the feedback capacitors 769 and 773. When CLK is high and CLKB is low, the OTA outputs op and om may be connected to integrator outputs outm and outp, respectively. The OTA inputs ip and im may be connected to negative input resistor 739 and positive input resistor 745, respectively. They may also be connected to DAC 731 and the feedback capacitors 769 and 773. Hence, the OTA inputs and outputs may be swapped at the MCLK rate, causing the OTA offset to be chopped at the MCLK rate.

As illustrated within FIG. 7, output chop switches may be connected between the output of the OTA and the integrator outputs. However, in an alternative embodiment, the output chop switches may be moved inside the OTA. That is, if the OTA was made of several stages, only the first stage of the OTA may be chopped.

Figure 8:
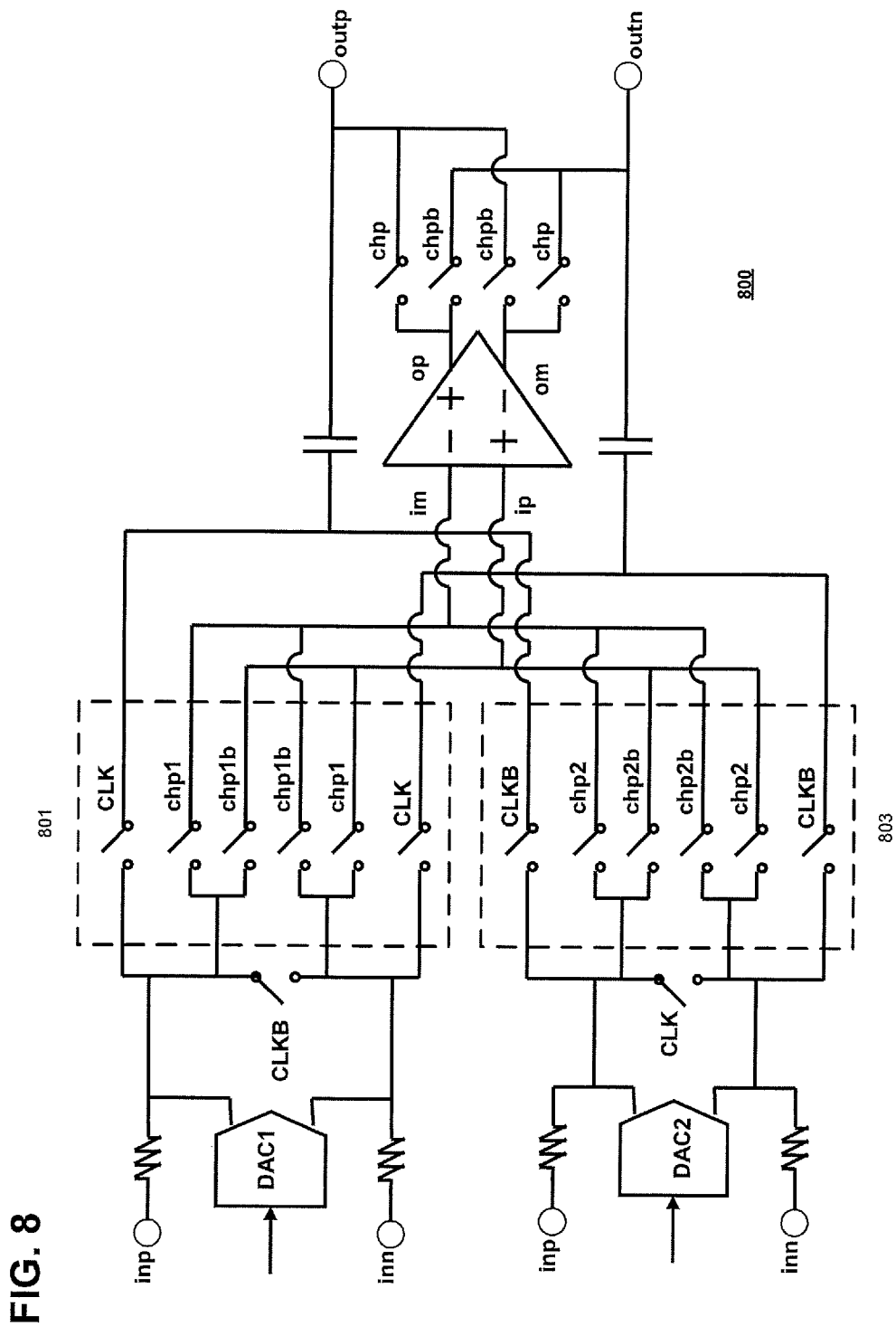
FIG. 8. illustrates an input stage of a continuous time sigma delta modulator ADC according to an embodiment of the present invention.
Figure 9:
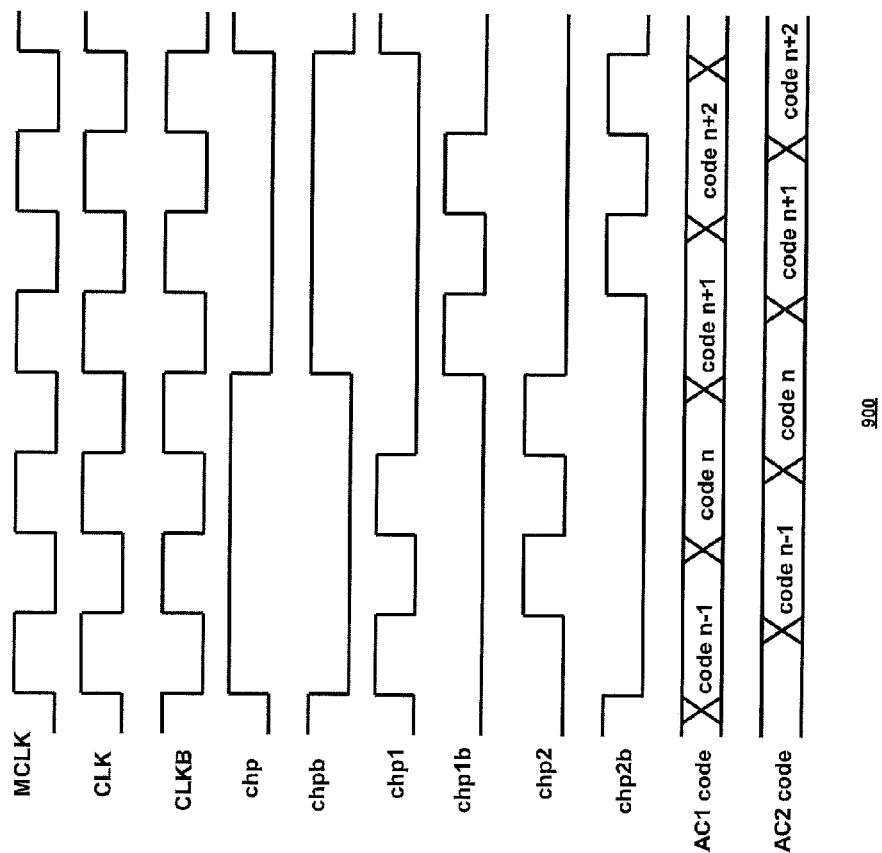
FIG. 9. illustrates a timing diagram for a sigma delta modulator with a continuous time input stage according to an embodiment of the present invention.

The scheme illustrated within FIG. 7 may allow for OTA chopping to occur at MCLK period=CLK period=CLKB period. It might be desirable to chop at a lower rate. Chopping at a lower rate may be done with additional input switches. As illustrated in FIG. 8, a set of additional input switches within each of switches 801 and switches 803 allows for chopping to be done at a lower rate, as illustrated within timing diagram 900 of FIG. 9. For example, FIG. 9 illustrates a timing diagram corresponding to FIG. 8 where the OTA is chopped at 2 times the MCLK period.

Figure 10:
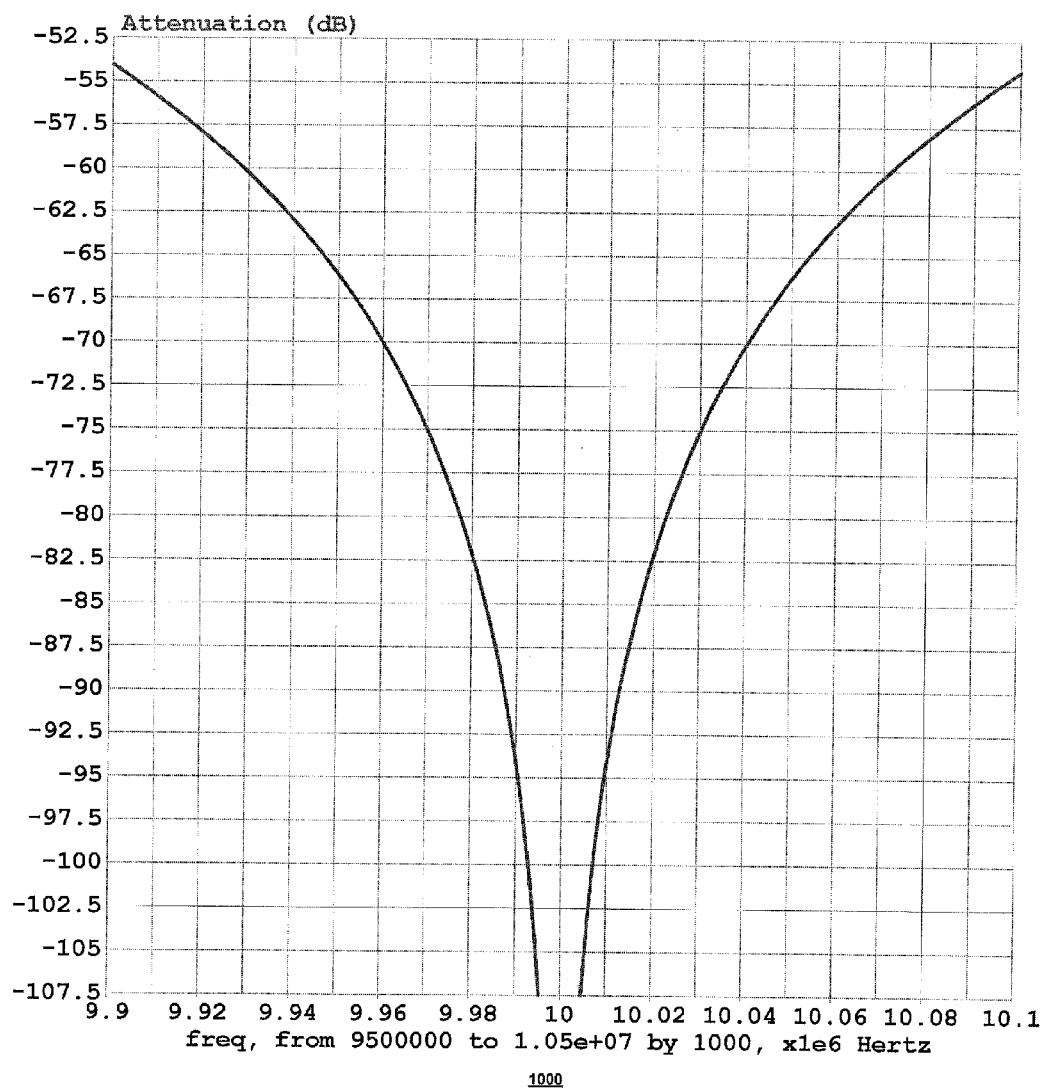
FIG. 10 is a graph illustrating the antialiasing effects of a sigma delta modulator with a continuous time input stage according to an embodiment of the present invention.

FIG. 10 is a graph illustrating the antialiasing effects of a standard continuous time $2^{nd}$ order sigma delta modulator sampling at 10 MHz. It shows that alias frequency in the range from 10 MHz-400 kHz to 10 MHz+400 kHz may be attenuated by 70 dB or more. Using the continuous time input stage according to an embodiment of the present invention, this alias rejection may be achieved. At the same time, linearity degradation caused by ISI and DAC glitches may be avoided.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:
1. A continuous time input stage, comprising:
a first digital-to-analog converter (DAC) including a first DAC code input;
a second DAC including a second DAC code input;
a first set of switches coupled to the output of the first DAC;

a second set of switches coupled to the output of the second DAC;

an amplifier configured, at input of the amplifier, to receive the output of either the first DAC or the second DAC based upon configuration of the first set of switches and the second set of switches; and at least one integrator capacitor coupled between an output of the amplifier and the input of the amplifier.

2. The continuous time input stage of claim 1, wherein the output of the first DAC is connected to the input of the amplifier based upon the configuration of the first set of switches.

3. The continuous time input stage of claim 1, wherein the output of the second DAC is connected to the input of the amplifier based upon the configuration of the second set of switches.

4. The continuous time input stage of claim 1, wherein the first DAC is configured to receive a new DAC code when the output of the second DAC is connected to the amplifier.

5. The continuous time input stage of claim 1, wherein the second DAC is configured to receive a new DAC code when the output of the first DAC is connected to the amplifier.

6. The continuous time input stage of claim 1, wherein the first set of switches are responsive to the state of a first clock and the second set of switches are responsive to the state of a second clock.

7. The continuous time input stage of claim 6, wherein the first set of switches are configured to connect the output of the first DAC to the amplifier when the first clock is in a high state and the second clock is in a low state.

8. The continuous time input stage of claim 6, wherein the second set of switches are configured to connect the output of the second DAC to the amplifier when the first clock is in a low state and the second clock is in a high state.

9. A continuous time input stage, comprising:
a first digital-to-analog converter (DAC) including a first DAC code input;
a second DAC including a second DAC code input;
a first pair of inputs, each coupled to an input resistor;
a second pair of inputs, each coupled to an input resistor;
a first set of switches coupled to the output of the first DAC;
a second set of switches coupled to the output of the second DAC; and
an amplifier configured, at input of the amplifier, to receive the output of either the first DAC or the second DAC based upon configuration of the first set of switches and the second set of switches; and
a third set of switches configured to connect an output of the amplifier with an integrator output of at least one integrator capacitor coupled between the output of the amplifier and the input of the amplifier.

10. The continuous time input stage of claim 9, wherein the third set of switches is located between the output of the amplifier and the integrator output.

11. The continuous time input stage of claim 9, wherein the third set of switches is located in the amplifier.

12. The continuous time input stage of claim 9, wherein the output of the first DAC is connected to the input of the amplifier based upon the configuration of the first set of switches.

13. The continuous time input stage of claim 9, wherein the output of the second DAC is connected to the input of the amplifier based upon the configuration of the second set of switches.

14. The continuous time input stage of claim 9, wherein the first DAC is configured to receive a new DAC code when the output of the second DAC is connected to the amplifier.

15. The continuous time input stage of claim 9, wherein the second DAC is configured to receive a new DAC code when the output of the first DAC is connected to the amplifier.

16. The continuous time input stage of claim 9, wherein the first set of switches are responsive to the state of a first clock, the second set of switches are responsive to the state of a second clock, a first subset of the third set of switches is responsive to the state of the first clock, and a second subset of the third set of switches is responsive to the state of the second clock.

17. The continuous time input stage of claim 16, wherein the first set of switches are configured to connect the output of the first DAC to the amplifier when the first clock is in a high state and the second clock is in a low state.

18. The continuous time input stage of claim 16, wherein the second set of switches are configured to connect the output of the second DAC to the amplifier when the first clock is in a low state and the second clock is in a high state.

19. The continuous time input stage of claim 16, wherein the third set of switches is configured to connect the output of the amplifier with the integrator output based upon the states of the first clock and the second clock.

20. A method for continuous time input, the method comprising:
determining that a first clock signal from a clock is in a high state;
activating a first set of switches based upon the determination that the first clock signal is in a high state;
receiving a new DAC code at a first DAC when the first set of switches are activated;
determining that a second clock signal from the clock is in a high state;
activating a second set of switches based upon the determination that the second clock signal is in a high state; and
receiving a new DAC code at a second DAC when the second set of switches are activated,
wherein an amplifier configured, at input of the amplifier, to receive the output of either the first DAC or the second DAC based upon configuration of the first set of switches and the second set of switches, and
at least one integrator capacitor coupled between output of the amplifier and the input of the amplifier, to generate integrated output.

21. The method of claim 20, further comprising:
chopping an amplifier input and output using a third set of switches based upon a state of the third set of switches, the chopping occurring at a rate that is a multiple of a frequency of the clock.

22. The method of claim 20, further comprising:
chopping an amplifier input and output using a third set of switches based upon a state of the third set of switches, the chopping occurring at a rate that is lower than a frequency of the clock.

* * * * *